United States Patent
Wang et al.

(10) Patent No.: US 7,298,203 B2
(45) Date of Patent: Nov. 20, 2007

(54) AMPLIFICATION SYSTEM CAPABLE OF REDUCING DC OFFSET

(75) Inventors: Yao-Chi Wang, Hsinchu (TW); Ying-Tang Chang, Sindian (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 141 days.

(21) Appl. No.: 11/365,514

(22) Filed: Mar. 2, 2006

(65) Prior Publication Data
US 2006/0208792 A1    Sep. 21, 2006

(30) Foreign Application Priority Data
Mar. 16, 2005   (TW) .............................. 94108090 A

(51) Int. Cl.
*H03F 1/02* (2006.01)
(52) U.S. Cl. ............................................. 330/9; 330/69
(58) Field of Classification Search .................... 330/9, 330/69, 84, 127 R, 126, 295
See application file for complete search history.

(56) References Cited

U.S. PATENT DOCUMENTS

| | | | |
|---|---|---|---|
| 6,697,611 B1 | 2/2004 | Franca-Neto | 455/296 |
| 7,126,419 B2 * | 10/2006 | Miyasita | 330/69 |
| 7,233,780 B2 * | 6/2007 | Franca-Neto | 455/296 |

* cited by examiner

*Primary Examiner*—Khanh Van Nguyen
(74) *Attorney, Agent, or Firm*—Bacon & Thomas, PLLC

(57) ABSTRACT

An amplification system capable of reducing DC offset in a baseband signal, which has first and second differential output terminals, first and second low pass filters, and first and second amplifiers. The first low pass filter filters a first input signal to thus generate a first filtered signal. The first amplifier amplifies the first input signal and the first filtered signal to thus generate a first amplified signal. The second low pass filter filters a second input signal to thus generate a second filtered signal. The second amplifier amplifies the second input signal and the second filtered signal to thus generate a second amplified signal. The system couples the first and second amplified signals at the first and the second differential output terminals to thus reduce the DC offset of a differential voltage signal output by the first and second differential output terminals.

12 Claims, 5 Drawing Sheets

AMPLIFICATION SYSTEM CAPABLE OF REDUCING DC OFFSET

BACKGROUND OF THE INVENTION

1. Field of the Invention

The invention relates to the technical field of amplifier and, more particularly, to an amplification system capable of reducing direct current (DC) offset of a baseband signal in a transceiver.

2. Description of Related Art

A zero-intermediate frequency (IF) receiver is also referred to as a direct conversion receiver to directly convert a radio frequency (RF) signal into a baseband signal. Recently, because of high integrity and low cost, the zero-IF receiver is widely used in a RF transceiver, even in a mobile chip. In the zero-IF receiver, an oscillating signal LO of a local oscillator is mixed with the RF signal because of leakage to an RF port of the receiver. When the receiver and mixer performs a conversion of down frequency, a leaked oscillating signal and the LO are self-mixing to result in an output baseband signal with a large DC offset so as to reduce the performance of the entire receiver.

To overcome this problem, U.S. Pat. No. 6,697,611 discloses a low pass filter (LPF) to obtain the DC offset, and the system subtracts the DC offset obtained from the input signal, thereby reducing the DC offset in the signal. As shown in FIG. 1, the DC offset is obtained by passing the input signal through an LPF 16. In addition, the output of the amplifier 2 is cross coupled to the output of the amplifier 1, and the DC offset is reduced by the first differential output line 24 and the second differential output line 26 since the two amplifiers 1 and 2 have the same gain. The input signal is sent to the amplifier 1 through the first differential lines 20 and the second differential line 22. The amplifier 1 is a differential amplifier. The differential amplifier can have a problem of distortion showing in the FIG. 2. As shown in FIG. 2, when there exists a positive bias voltage between the input differential voltage Vip and the input differential voltage Vin, a bias current of the transistor Tr1 is greater than that of the transistor Tr2. Then, the transconductance of the transistor Tr1 is higher than that of the transistor Tr2 such that an absolute gain between Vip and Von is higher than that between Vin and Vop. Accordingly, the amplifier distortion is presented and easily causes poor linearity.

Therefore, it is desirable to provide an improved method to mitigate and/or obviate the aforementioned problems.

SUMMARY OF THE INVENTION

The object of the invention is to provide an amplification system capable of reducing direct current (DC) offset of a signal, which can avoid the amplifier distortion caused by different DC offsets at positive and negative input terminals of an amplifier, and increase the linearity of the amplifier.

To achieve the aforementioned object, there is provided an amplification system capable of reducing direct current (DC) offset in a signal. The system includes a first differential input terminal, a second differential input terminal, first and second differential output terminals, a first low pass filter, a first amplifier, a second low pass filter and a second amplifier. The first and second differential input terminals receive a first input signal and a second input signal respectively. The first low pass filter is connected to the first differential input terminal to filter the first input signal to thus generate a first filtered signal. The first amplifier is coupled between the first differential input terminal, first low pass filter, the first differential output terminal and the second differential output terminal to amplify the first input signal and the first filtered signal to thus generate a first amplified signal at the first differential output terminal and the second differential output terminal. The second low pass filter is connected to the second differential input terminal to filter the second input signal to thus generate a second filtered signal. The second amplifier is coupled between the second differential input terminal and second low pass filter and the first and second differential output terminals to amplify the second input signal and the second filtered signal to thus generate a second amplified signal at the first differential output terminal and the second differential output terminal. The second amplifier is connected to the first differential output terminal and the second differential output terminal such that the first amplified signals is coupled to the second amplified signals at the first differential output terminal and the second differential output terminal.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
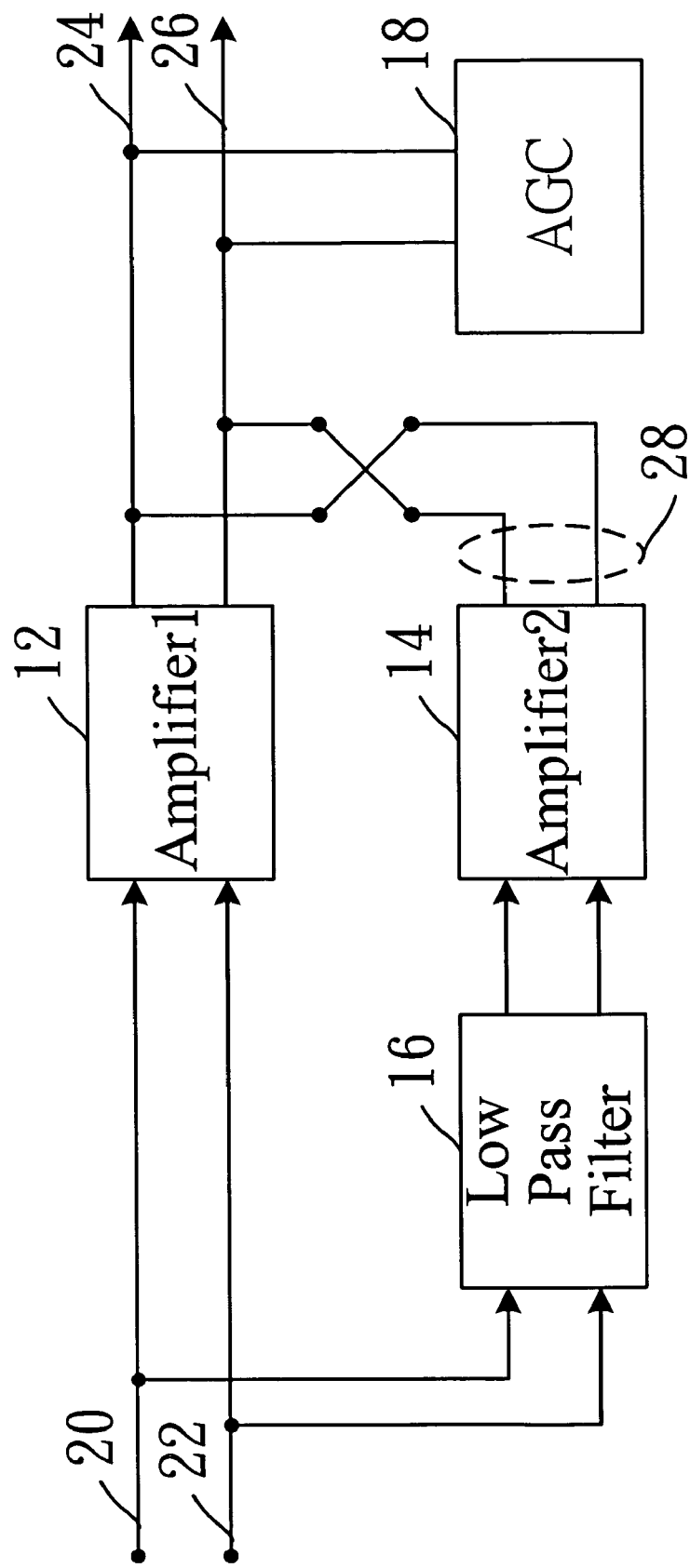
FIG. 1 is a block diagram of a conventional amplification system.
Figure 2:
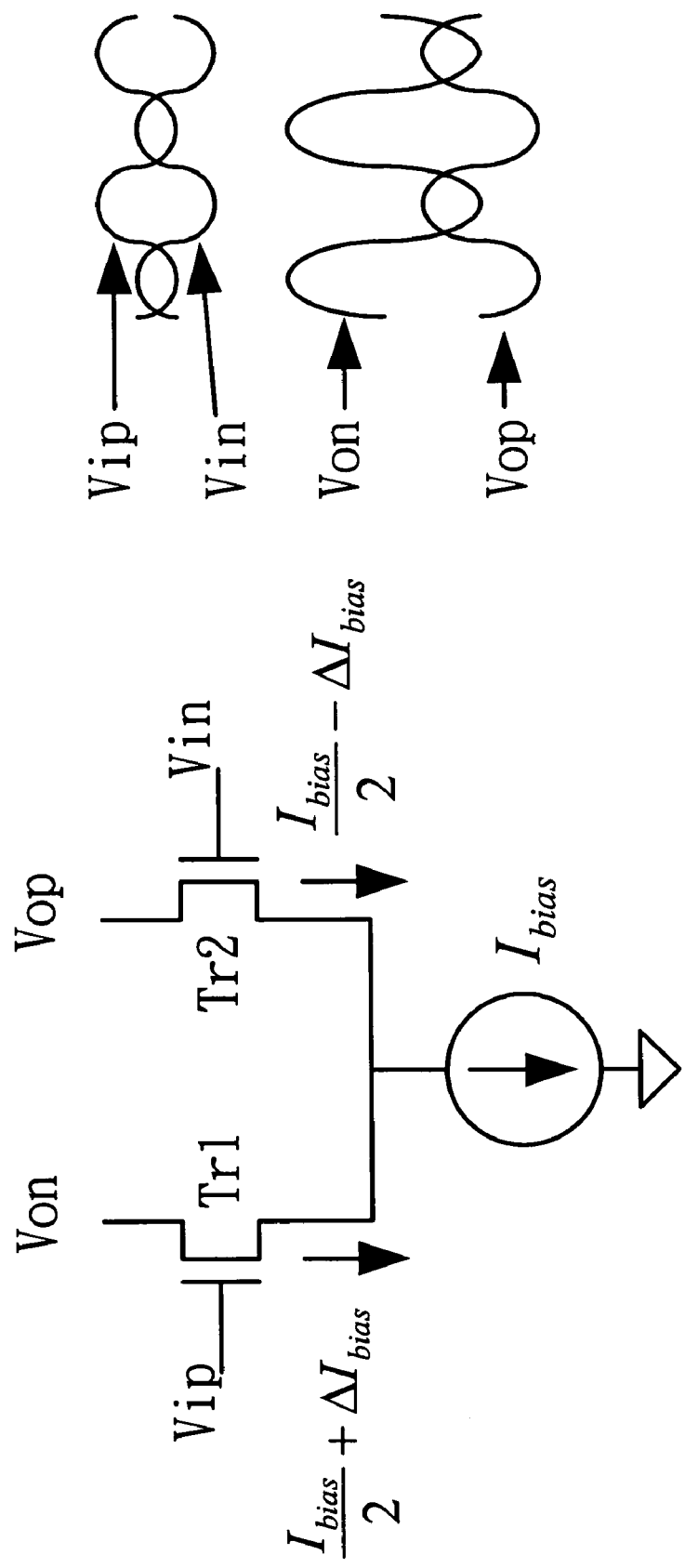
FIG. 2 is a schematic diagram of a distortion caused by a conventional differential amplifier.
Figure 3:
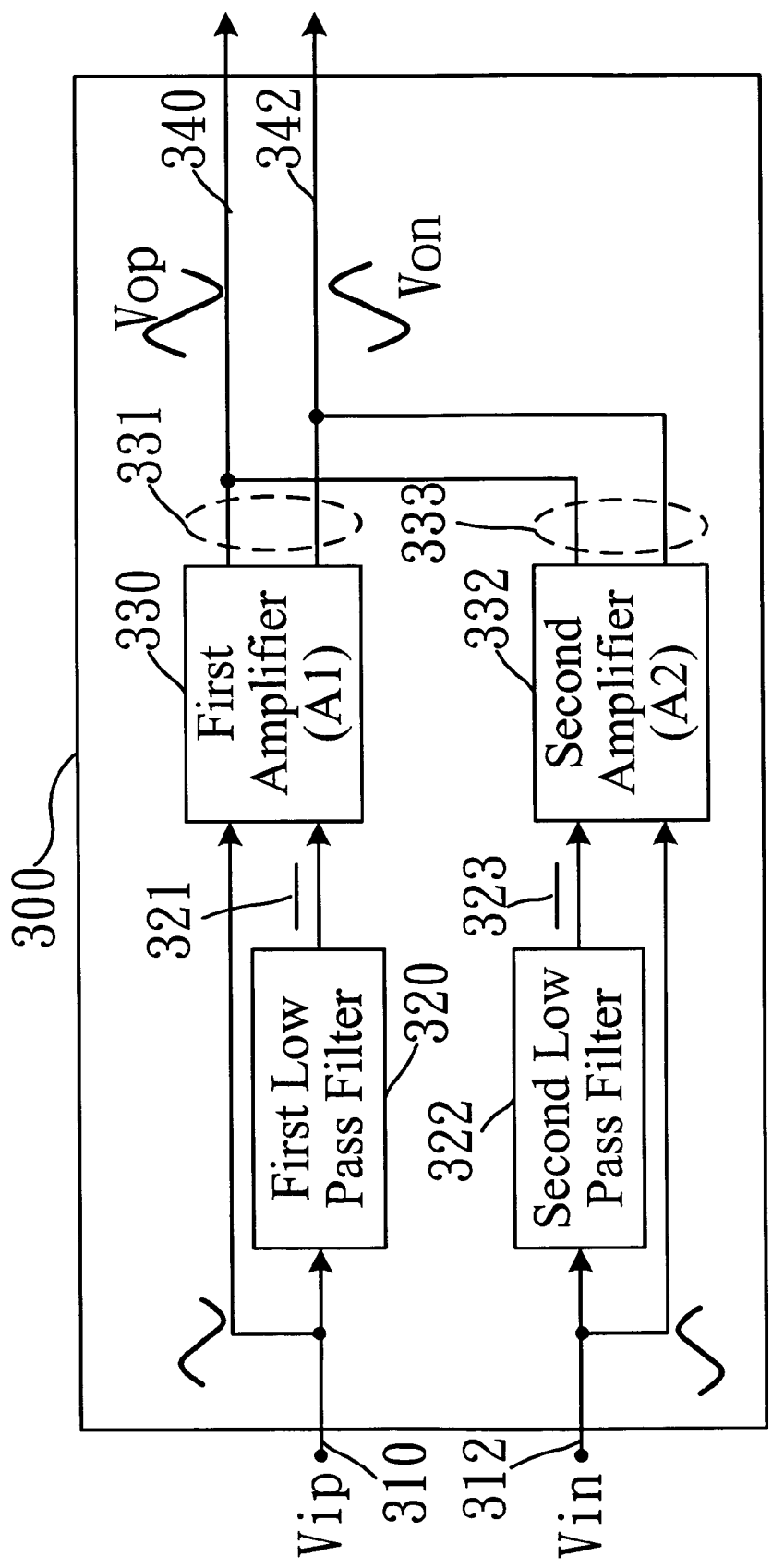
FIG. 3 is a block diagram of an amplification system capable of reducing direct current (DC) offset in a signal in accordance with the invention.

FIG. 3 is a block diagram of an amplification system capable of reducing direct current (DC) offset in a signal in accordance with the invention. As shown, the system includes a first differential input terminal 310, a second differential input terminal 312, a first differential output terminal 340, a second differential output terminal 342, a first low pass filter 320, a first amplifier 330, a second low pass filter 322 and a second amplifier 332.

The first differential input terminal 310 and the second differential input terminal 312 receive a first input signal Vip and a second input signal Vin respectively. The first input signal Vip and the second input signal Vin are a pair of differential input signals that are analog signals with DC offset. The first low pass filter 320 is connected to the first differential input terminal 310 to filter the first input signal Vip to thus generate a first filtered signal 321. The first low pass filter 320 filters out the high frequency component of the first input signal Vip, and thus the first filtered signal 321 is the DC component of the first input signal Vip. The first amplifier 330 has a first input and a second input coupled to the first differential input terminal 310 and the first low pass filter 320, respectively, and a first output and a second output coupled to the first differential output terminals 340 and the second differential output terminal 342, respectively, in order to amplify the first input signal Vip and the first filtered signal 321, thereby generating a first amplified signal 331 at the first output and the second output. The first amplified signal 331 is an analog signal with DC offset.

The second low pass filter 322 is connected to the second differential input terminal 312 to filter the second input signal Vin to thus generate a second filtered signal 323. The first low pass filter 320 and the second low pass filter 322 filter out all signals whose frequencies outside a small band about DC. Accordingly, the first low pass filter 320 outputs the DC component of the first input signal Vip, and the second low pass filter 322 outputs the DC component of the second input signal Vin. Namely, the first filtered signal 321 is the DC component of the first input signal Vip, and the second filtered signal 323 is the DC component of the first input signal Vin.

The second amplifier 332 has a first input and a second input coupled to the second low pass filter 322 and the second differential input terminal 312, respectively, and a first output and a second output coupled to the first differential output terminals 340 and the second differential output terminal 342, respectively, in order to amplify the second input signal Vin and the second filtered signal 323, thereby generating a second amplified signal 333 at the first and second output. The second amplified signal 333 is an analog signal with DC offset. Because the second amplifier 332 is connected to the first differential output terminals 340 and the second differential output terminal 342, the first amplified signal 331 is cross coupled to the second amplifying signal 333 at the first differential output terminals 340 and the second differential output terminal 342.

The first amplifier 330 and the second amplifier 332 match to each other and have the same gain. Both the first amplifier 330 and the second amplifier 332 have the first output and the second output, and the first output and the second output of the first amplifier 330 are cross coupled to first output and second output of the second amplifier 332 respectively.

The first and second differential output terminals 340, 342 have the output signals Vop, Von represented by the following equations as:

$$Vop=[Vip(DC)+Vip(AC)]*A1+Vin(DC)*A2 \quad (1),$$

$$Von=[Vin(DC)+Vin(AC)]*A2+Vip(DC)*A1 \quad (2),$$

where A1 and A2 are respective gains of the first and the second amplifiers 330 and 332. Based on assuming that A1=A2=A, the first and second differential output terminals 340, 342 have a differential voltage (Vop−Von) of:

$$Vop - Von = [Vip(DC) + Vip(AC)] * A + Vin(DC) * A - \quad (3)$$
$$[Vin(DC) + Vin(AC)] * A - Vip(DC) * A$$
$$= [Vip(AC) - Vin(AC)] * A.$$

As shown in equation (3), a differential voltage of the output terminals of the amplification system 300 is associated only with the alternating current (AC) component of the differential voltage of the input terminals. In this case, the amplification system 300 can effectively filter out the DC component of the input differential signal without regarding to the amplitude of the DC component.

Figure 4:
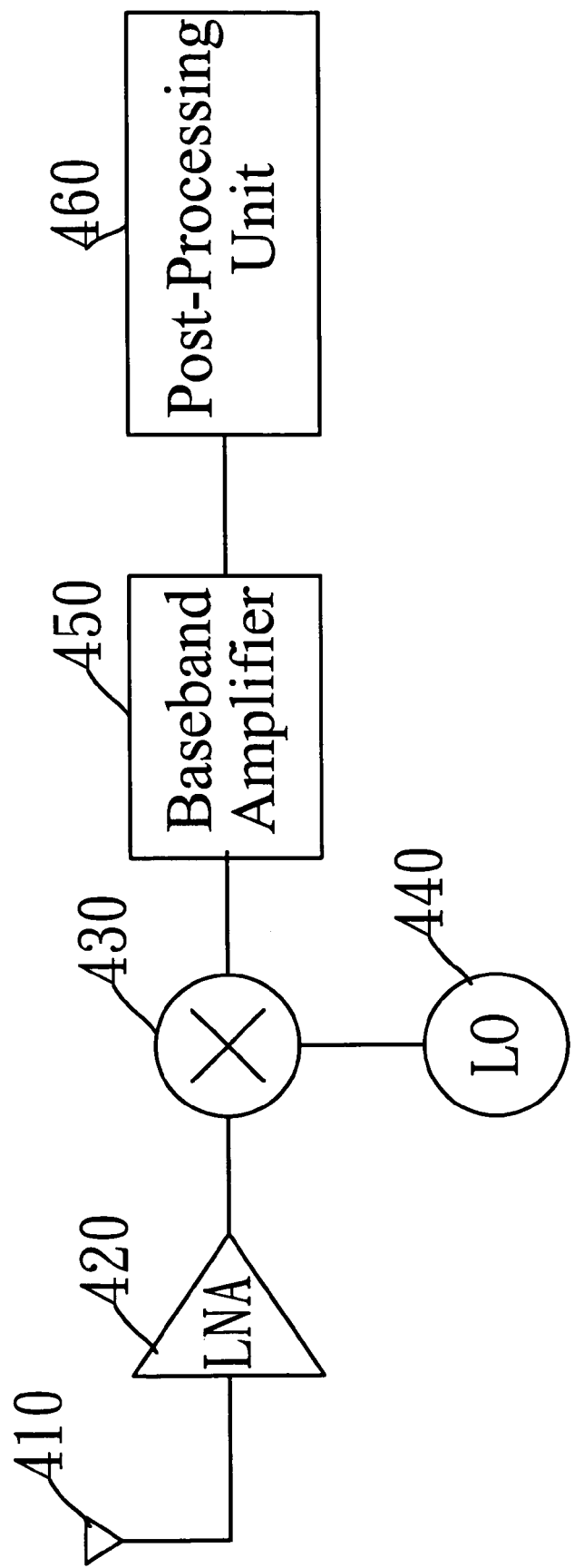
FIG. 4 is a block diagram of a receiver system in accordance with the invention.

FIG. 4 is a block diagram of a receiver in accordance with the invention. As shown, the receiver includes a radio frequency antenna 410, a low noise amplifier (LNA) 420, a mixer 430, a local oscillator (LO) 440, a baseband amplifier 450 and a post-processing unit 460. As shown in FIG. 4, the baseband amplifier 450 uses the amplification system 300 of FIG. 3. Thus, even a baseband signal contains a DC offset, the amplification system 300 can effectively filter out the DC offset of the baseband signal.

Figure 5:
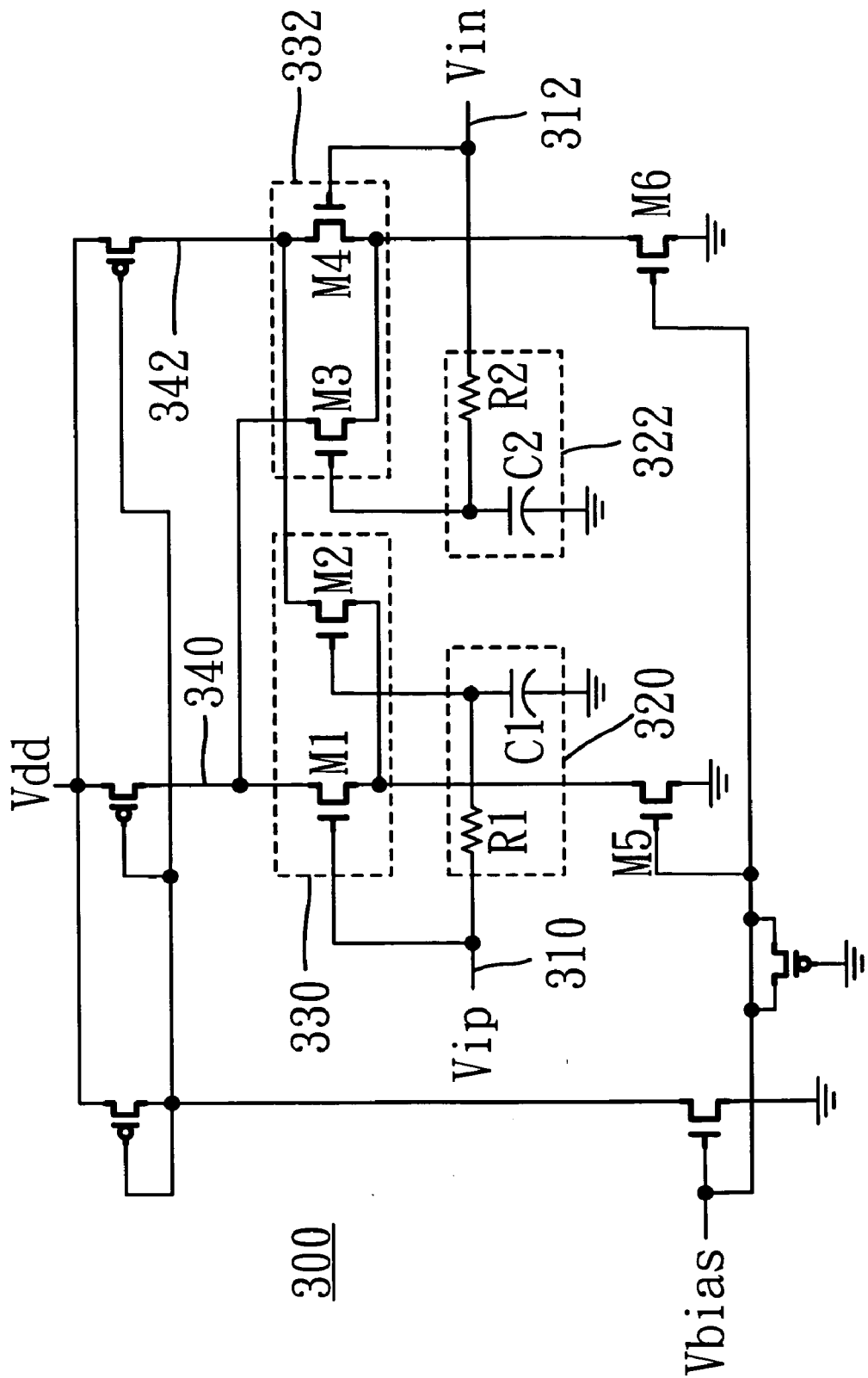
FIG. 5 shows a detail circuit of FIG. 3 in accordance with the invention.

FIG. 5 shows a detail circuit of FIG. 3 in accordance with the invention. As shown in FIG. 5, the first low pass filter 320 includes a first resistor R1 and a first capacitor C1. The first resistor R1 has one end connected to the first differential input terminal 310, and the other end connected to a gate of a transistor M2 and one end of the first capacitor C1. The other end of the first capacitor C1 is grounded. The first resistor R1 can be a switch resistor bank, and the first capacitor C1 can be a switch capacitor bank.

The first amplifier 330 includes NMOS transistors M1 and M2. The transistor M1 has a drain connected to the first differential output terminal 340, a gate connected to the first differential input terminal 310, and a source connected to a source of the transistor M2 and a drain of transistor M5. The transistor M5 is a current mirror. The transistor M2 has a drain connected to the second differential output terminal 342.

The second low pass filter 322 includes a second resistor R2 and a second capacitor C2. The second R2 has one end connected to the second differential input terminal 312, and the other end connected to a gate of a transistor M3 and one end of the second capacitor C2. The other end of the second capacitor C2 is grounded. The second resistor R2 can be a switch resistor bank, and the second capacitor C2 can be a switch capacitor bank.

The second amplifier 332 includes NMOS transistors M3 and M4. The transistor M3 has a drain connected to the first differential output terminal 340, and a source connected to a source of the transistor M4 and a drain of transistor M6. The transistor M6 is a current mirror. The transistor M4 has a drain connected to the second differential output terminal 342, and a gate connected to the second differential input terminal 312.

As cited, due to the different DC offset between the positive and negative terminals of the conventional amplifier 1, the multiplication at the positive and negative terminals of the conventional amplifier 1 is different, and thus it causes the amplifier distortion and poor linearity. Accordingly, the invention uses the first amplifier 330 and the second amplifier 332 to process the DC offset presented at the first differential input terminal 310 and the second differential input terminal 312 respectively, thereby reducing the DC offset of the first amplified signal 331 and second amplified signal 333 at the first differential output terminal 340 and second differential output terminal 342. Further, compared to the prior art, the invention has the advantages of easy integration and low cost, in addition to avoiding the amplifier distortion caused by the different DC offsets presented at the positive and negative terminals.

Although the present invention has been explained in relation to its preferred embodiment, it is to be understood that many other possible modifications and variations can be made without departing from the spirit and scope of the invention as hereinafter claimed.

What is claimed is:

1. An amplification system capable of reducing direct current (DC) offset in a signal, comprising:
   a first differential input terminal and a second differential input terminal, which receive a first input signal and a second input signal respectively;
   a first differential output terminal and a second differential output terminal;

a first low pass filter, which is connected to the first differential input terminal to filter the first input signal to thus generate a first filtered signal;

a first amplifier having a first input and a second input coupled to the first differential input terminal and the first low pass filter, respectively, and a first output and a second output coupled to the first differential output terminal and the second differential output terminal, respectively, in order to amplify the first input signal and the first filtered signal to thus generate a first amplified signal at the first output and the second output;

a second low pass filter, which is connected to the second differential input terminal to filter the second input signal to thus generate a second filtered signal; and a second amplifier having a first input and a second input coupled to the second low pass filter and the second differential input terminal, respectively, and a first output and a second output coupled to the first differential output terminal and the second differential output terminal, respectively, in order to amplify the second input signal and the second filtered signal to thus generate a second amplified signal at the first output and the second output, whereby the first amplified signal is cross coupled to the second amplified signal at the first differential output terminal and second differential output terminal.

2. The system as claimed in claim 1, wherein the first low pass filter and the second low pass filter filter out all signals whose frequencies outside a band around direct current.

3. The system as claimed in claim 1, wherein the first low pass filter comprises a first resistor and a first capacitor.

4. The system as claimed in claim 3, wherein the first resistor has one end connected to the first differential input terminal and the other end connected to the first amplifier and one end of the first capacitor, and the other end of the first capacitor is connected to a ground node.

5. The system as claimed in claim 4, wherein the first resistor is a switch resistor bank.

6. The system as claimed in claim 4, wherein the first capacitor is a switch capacitor bank.

7. The system as claimed in claim 1, wherein the second low pass filter comprises a second resistor and a second capacitor.

8. The system as claimed in claim 7, wherein the second resistor has one end connected to the second differential input terminal and the other end connected to the second amplifier and one end of the second capacitor, and the other end of the second capacitor is connected to the ground node.

9. The system as claimed in claim 8, wherein the second resistor is a switch resistor bank.

10. The system as claimed in claim 8, wherein the second resistor is a switch capacitor bank.

11. The system as claimed in claim 1, wherein the first and the second amplifiers are matched to each other.

12. The system as claimed in claim 1, wherein the first and the second amplifiers have a same gain.

* * * * *